(12) United States Patent
Sakai

(10) Patent No.: US 11,575,048 B2
(45) Date of Patent: Feb. 7, 2023

(54) DISPLAY DEVICE

(71) Applicant: Japan Display Inc., Tokyo (JP)

(72) Inventor: Takeshi Sakai, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 17/655,099

(22) Filed: Mar. 16, 2022

(65) Prior Publication Data

US 2022/0310847 A1  Sep. 29, 2022

(30) Foreign Application Priority Data

Mar. 26, 2021 (JP) .............................. JP2021-053676

(51) Int. Cl.
| | |
|---|---|
| *H01L 29/786* | (2006.01) |
| *H01L 29/40* | (2006.01) |
| *G02F 1/1362* | (2006.01) |
| *G02F 1/1368* | (2006.01) |
| *H01L 27/32* | (2006.01) |
| *H01L 27/12* | (2006.01) |

(52) U.S. Cl.
CPC ...... *H01L 29/78606* (2013.01); *H01L 29/404* (2013.01); *G02F 1/1368* (2013.01); *G02F 1/136218* (2021.01); *H01L 27/1244* (2013.01); *H01L 27/3272* (2013.01); *H01L 29/7869* (2013.01)

(58) Field of Classification Search
CPC ............. H01L 29/78606; H01L 29/404; H01L 27/1244; H01L 27/3272; G02F 1/136218
USPC ..................................... 349/42–44, 110–111
See application file for complete search history.

(56) References Cited

U.S. PATENT DOCUMENTS

2006/0243979 A1* 11/2006 Park ................... G02F 1/136209
257/E27.111
2013/0299819 A1  11/2013 Yamazaki et al.

* cited by examiner

*Primary Examiner* — Charles S Chang
(74) *Attorney, Agent, or Firm* — Maier & Maier, PLLC

(57) ABSTRACT

A display device including a plurality of thin film transistors. One of the plurality of thin film transistors includes a gate electrode, a semiconductor layer having a region overlapping the gate electrode, a gate insulating layer between the gate electrode and the semiconductor layer, a source electrode and a drain electrode in contact with a surface of the semiconductor layer opposite to the side of the gate insulating layer, and a first shield electrode arranged in a region where the source electrode and the gate electrode overlap, and a second shield electrode arranged in a region where the drain electrode and the gate electrode overlap. The first shield electrode and the second shield electrode are arranged between the gate electrode and the semiconductor layer, and are insulated from the gate electrode, the semiconductor layer, the source electrode, and the drain electrode.

10 Claims, 7 Drawing Sheets

DISPLAY DEVICE

CROSS-REFERENCE TO RELATED APPLICATIONS

This application is based upon and claims the benefit of priority from the prior Japanese Patent Application No. 2021-053676, filed on Mar. 26, 2021, the entire contents of which are incorporated herein by reference.

BACKGROUND OF THE INVENTION

1. Field of the Invention

An embodiment of the present invention relates to the structure of a transistor. An embodiment of the present invention relates to a structure of a transistor arranged in a display device.

2. Description of Related Art

A circuit board (also called a backplane) for driving a liquid crystal or an organic EL element of a flat panel display is formed of a circuit using a thin film transistor. Thin film transistors are formed of thin films of semiconductors, metals, and insulators. The thin film transistor has variations in the arrangement of a gate electrode, a semiconductor layer (active layer), a source electrode, and a drain electrode, and several device structures are known. For example, Japanese Patent Laid-Open No. 2013-254950 discloses a structure of a reverse stagger type (also called a bottom gate type) in which a gate insulating layer and a semiconductor layer are laminated on a gate electrode, and a source electrode and a drain electrode form a contact on the upper surface of the semiconductor layer.

It is required for the display panel to be driven at a specified voltage so that the thin film transistor of the backplane has no characteristic variation due to manufacturing and no characteristic variation with time. However, it is known that the characteristics of a thin film transistor may fluctuate (degradation) due to a bias stress effect. The bias stress effect is observed as a phenomenon in which the threshold voltage gradually fluctuates when a constant voltage is continuously applied to the thin film transistor. Although a constant voltage is not continuously applied to the thin film transistor in the backplane of the display panel, the input of a signal and the holding of a signal are periodically performed in a pixel circuit or the like, so that a condition in which a predetermined potential difference occurs repeatedly for a fixed time between a gate and a source and between a gate and a drain appears. The bias stress effect is not negligible for thin film transistors.

SUMMARY OF THE INVENTION

A display device in an embodiment according to the present invention including a plurality of thin film transistors, one of the plurality of thin film transistors including a gate electrode, a semiconductor layer having a region overlapping the gate electrode, a gate insulating layer between the gate electrode and the semiconductor layer, a source electrode and a drain electrode in contact with a surface of the semiconductor layer opposite to the side of the gate insulating layer, and a first shield electrode arranged in a region where the source electrode and the gate electrode overlap, and a second shield electrode arranged in a region where the drain electrode and the gate electrode overlap. The first shield electrode and the second shield electrode are arranged between the gate electrode and the semiconductor layer, and are insulated from the gate electrode, the semiconductor layer, the source electrode, and the drain electrode.

DESCRIPTION OF THE EMBODIMENTS

Figure 1A:
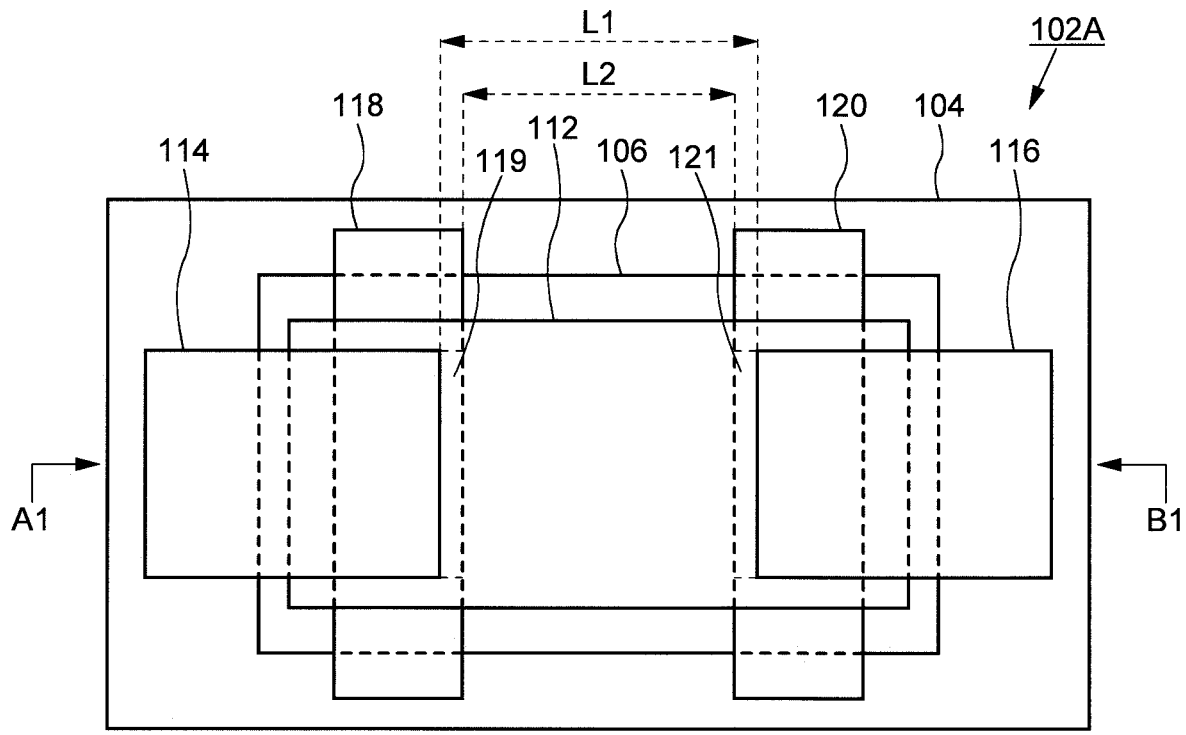
FIG. 1A shows a plan view of a transistor utilized in a display device according to an embodiment of the present invention.

Hereinafter, embodiments of the present invention will be described with reference to the drawings and the like. The present invention may be carried out in various forms without departing from the gist thereof, and is not to be construed as being limited to any of the following embodiments. Although the drawings may schematically represent the width, thickness, shape, and the like of each part in comparison with the actual embodiment in order to clarify the description, they are merely examples and do not limit the interpretation of the present invention. In the present specification and each of the figures, elements similar to those described previously with respect to the figures already mentioned are designated by the same reference numerals (or numbers followed by a, b, etc.), and a detailed description thereof may be omitted as appropriate. Furthermore, the characters "first" and "second" appended to each element are convenient signs used to distinguish each element, and have no further meaning unless specifically described.

As used herein, where a member or region is "on" (or "below") another member or region, this includes cases where it is not only directly on (or just under) the other member or region but also above (or below) the other member or region, unless otherwise specified. That is, it includes the case where another component is included in between above (or below) other members or regions.

First Embodiment

Figure 1B:
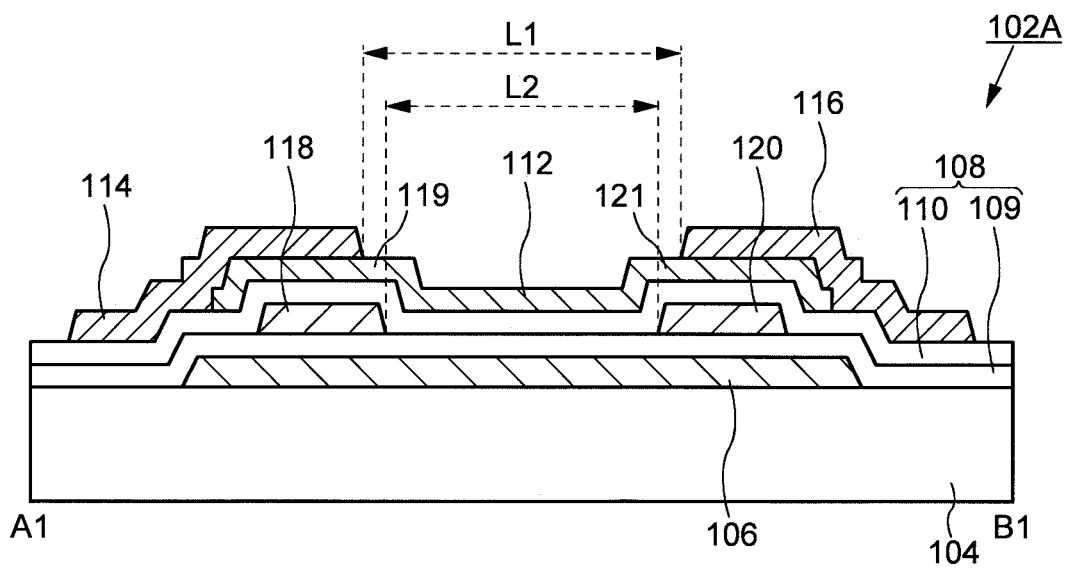
FIG. 1B shows a cross-sectional view of a transistor utilized in a display device according to an embodiment of the present invention.

FIG. 1A and FIG. 1B show a structure of a transistor 102A used in a display device according to an embodiment of the present invention. FIG. 1A shows a plan view of the transistor 102A, and FIG. 1B shows a cross-sectional structure along the line A1-B1 shown in FIG. 1A. FIG. 1A and FIG. 1B are referred to as appropriate in the following description.

The transistor 102A includes a gate electrode 106, a gate insulating layer 108, a semiconductor layer 112, a source electrode 114 and a drain electrode 116, a first shield electrode 118 and a second shield electrode 120. The gate electrode 106 is arranged on the substrate 104, and the gate insulating layer 108 is arranged to cover the gate electrode 106. The semiconductor layer 112 is arranged on the gate insulating layer 108, and at least a part of the semiconductor layer 112 is arranged to overlap the gate electrode 106. The source electrode 114 and the drain electrode 116 are arranged to make a contact on the surface of the semiconductor layer 112 opposite to the surface on the side of the gate insulating layer 108.

The transistor 102A includes a region in which the gate electrode 106, the gate insulating layer 108, the semiconductor layer 112, the source electrode 114, and the drain electrode 116 overlap in the longitudinal direction. In the transistor 102A, voltages of different levels are applied to the gate electrode 106, the source electrode 114, and the drain electrode 116 during operation, therefore, when the first shield electrode 118 and the second shield electrode 120 are not present, an electric field is generated between the gate electrode 106 and the source electrode 114, and between the gate electrode 106 and the drain electrode 116.

In contrast, the first shield electrode 118 and the second shield electrode 120 are arranged in the transistor 102A to shut off the electric field between the gate and the source and between the gate and the drain. The first shield electrode 118 is arranged on a region where the source electrode 114 overlaps the gate electrode 106 interposing the semiconductor layer 112 therebetween, and the second shield electrode 120 is arranged on a region where the drain electrode 116 overlaps the gate electrode 106 interposing the semiconductor layer 112 therebetween. That is, the first shield electrode 118 and the second shield electrode 120 are arranged to be at least partially overlap the gate electrode 106. The first shield electrode 118 is insulated from the source electrode 114, the semiconductor layer 112, and the gate electrode 106, and the second shield electrode 120 is insulated from the drain electrode 116, the semiconductor layer 112, and the gate electrode 106. The first shield electrode 118 and the second shield electrode 120 are controlled to a constant potential.

For example, the first shield electrode 118 and the second shield electrode 120 are grounded. Also, the first shield electrode 118 and the second shield electrode 120 are applied with a predetermined constant voltage.

The first shield electrode 118 and the second shield electrode 120 are embedded in the gate insulating layer 108. For example, the gate insulating layer 108 includes a first gate insulating layer 109 and a second gate insulating layer 110 laminated from the substrate 104 side, and the first shield electrode 118 and the second shield electrode 120 are arranged between the first gate insulating layer 109 and the second gate insulating layer 110.

Different voltages are applied to the gate electrode, the source electrode, and the drain electrode when the transistor in the display device is in operation. A voltage for controlling ON/OFF of the transistor or a voltage for controlling the level of the drain current may be applied to the gate electrode, a voltage based on the video signal may be applied to the source electrode, and a power supply voltage may be applied to the drain electrode. Since the voltages applied to the gate electrode, the source electrode and the drain electrode are different in level and timing, a potential difference is generated between the gate electrode and the source electrode and between the gate electrode and the drain electrode, and an electric field is generated based on the potential difference.

Figure 2A:
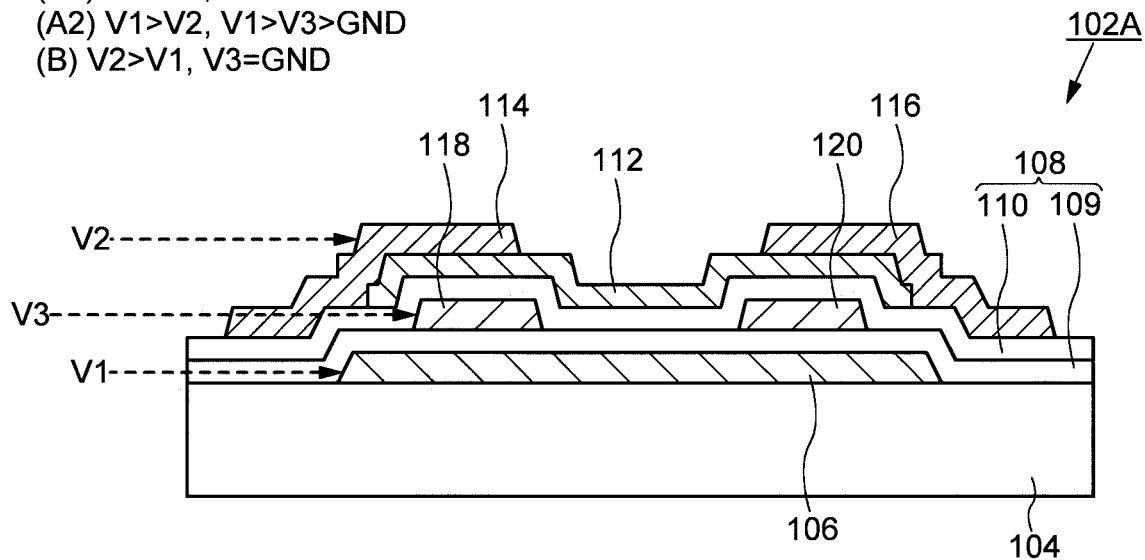
FIG. 2A shows an example of a bias state of a transistor explained in one embodiment of the present invention.
Figure 2B:
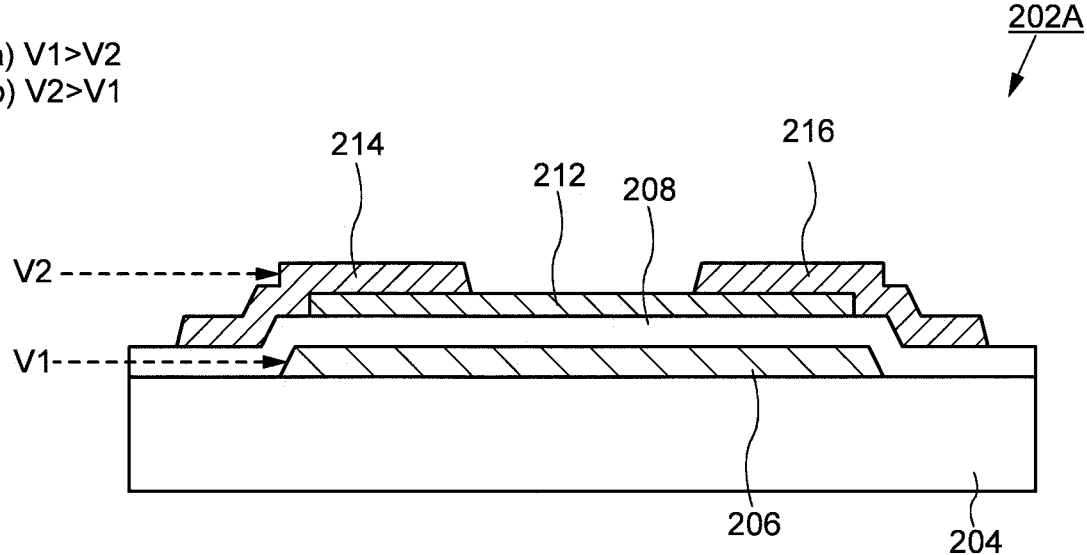
FIG. 2B shows a bias state of a transistor in which no shield electrode is arranged.

FIG. 2A shows the structure of the transistor 102A according to the present embodiment, and FIG. 2B shows the structure of the transistor 202A without a shield electrode arranged on the substrate 204.

(a) When a positive voltage of V1 is applied to the gate electrode 206 and a voltage of V2=0 V is applied to the source electrode 214 (V1>V2) in the transistor 202A shown in FIG. 2B, a positive stress voltage calculated as V1−V2 is applied between the gate electrode and the source electrode. For example, when V1=+10 V, a stress voltage of +10 V will be applied to the transistor 202.

(b) When a negative voltage of V1 is applied to the gate electrode 206 and a positive voltage of V2 is applied to the source electrode 214, a negative stress voltage calculated as −V1−V2 is applied. For example, if −V1=−5 V and +V2=8 V, a stress voltage of −13 V will be applied to transistor 202.

The bias stress generated under the conditions (a) and (b) may be periodically repeated depending on the driving conditions of the transistor 202. The transistor 202 is degraded by bias stress due to such driving conditions.

On the other hand, the transistor 102A shown in FIG. 2A is, as described above, (A1) when a voltage of +V1 is applied to the gate electrode 206, a voltage of V2=0 V is applied to the source electrode 214 (V1>V2), and the first shield electrode 118 is grounded (V3=0 V), the potential difference between the source electrode 114 and the first shield electrode 118 of the transistor 102A becomes V3−V2=0, then the transistor 102A is substantially free from bias stress. (B) When a voltage of −V1 (−5 V) is applied to the gate electrode 206 and a voltage of +V2 (+8 V) is applied to the source electrode 214, the potential difference between the source electrode 114 and the first shield electrode 118 of the transistor 102A is V3−V2 (0 V−8 V=−8 V), and the magnitude of the absolute value of the bias stress is smaller than that in the case of (b) above.

When the display device is driven, the state (A1) appears in one or more writing periods in 1 frame (16.6 msec). Assuming that the length of the write period at this time is, for example, 20 μsec, when the state (A1) is once, it is 20 μsec, and when it is 2 times, it is 40 μsec. The state (B) may last for a period of 16.56 msec excluding the above 40 μsec in 1 frame (16.6 msec) (non-selected period). At least two bias stresses having different polarities are applied to a transistor (a transistor arranged in a pixel) for driving a display device. However, it is possible to reduce the degradation of the characteristics of transistor 102A, since the absolute value of the stressing voltage becomes small by providing the first shield electrode 118 and second shield electrode 120, as described above.

Thus, it is possible to reduce the influence of bias stress by arranging the first shield electrode 118 between the gate electrode 106 and the source electrode 114. It is also possible to obtain the reduction effect of the bias stress by the second shield electrode 120 arranged between the gate electrode 106 and the drain electrode 116. It is preferable to arrange the shield electrodes on both the source electrode side and the drain electrode side in order to reduce the bias stress effect, since different voltages may be applied to the source electrode 114 and the drain electrode 116 with respect to the gate electrode 106.

The source electrode 114 and the drain electrode 116 are arranged in a region overlapping the gate electrode 106 with one end of both electrodes facing each other as shown FIG. 1A and FIG. 1B. FIG. 1A and FIG. 1B show a distance (interval) between one end of the source electrode 114 and one end of the drain electrode 116 as L1. When the first shield electrode 118 and the second shield electrode 120 are not arranged, L1 corresponds to a length defined as a channel length.

The first shield electrode 118 and the second shield electrode 120 are arranged so that one end of both shield electrodes face each other in a region overlapping the gate electrode 106. In this arrangement, the end of the first shield electrode 118 is arranged inside the end of the source electrode 114 (inside of the gate electrode), and the end of the second shield electrode 120 is arranged inside the end of the drain electrode 116 (inside of the gate electrode), in the transistor 102A shown in FIG. 1A and FIG. 1B. FIG. 1A and FIG. 1B show the distance (interval) between the one end of the first shield electrode 118 and the one end of the second shield electrode 120 as L2. As apparent from the structure shown, the distance L2 between the first shield electrode 118 and the second shield electrode 120 is smaller than the distance L1 between the source electrode 114 and the drain electrode 116, that is, L2<L1.

The first shield electrode 118 and the second shield electrode 120 have a function of shielding an electric field generated from spreading to the semiconductor layer 112 by the gate electrode 106, as shown in FIG. 1A and FIG. 1B. The channel length of the transistor 102A according to the present embodiment is defined by L2. That is, the channel length of the transistor 102A is defined by the distance between the first shield electrode 118 and the second shield electrode 120, not the distance between the source electrode 114 and the drain electrode 116.

The end of first shield electrode 118 and the end of second shield electrode 120 are arranged inside the end of the source electrode 114 and the drain electrode 116. The transistor 102A has a first region 119 in which the semiconductor layer 112 overlaps the first shield electrode 118 and does not overlap the source electrode 114, and a second region 121 in which the semiconductor layer 112 overlaps the second shield electrode 120 and does not overlap the drain electrode 116. The first region 119 and the second region 121 are not affected to the electric field by the gate electrode 106, and an offset region is formed in the transistor 102A when the first shield electrode 118 and the second shield electrode 120 are grounded. Although the offset region slightly decreases the on-current of the transistor 102A, the breakdown voltage can be increased.

Further, the first shield electrode 118 and the second shield electrode 120 are applied with a voltage higher than the ground potential and lower than an ON voltage (voltage for turning on the transistor 102A) applied to the gate electrode 106, whereby carriers can be induced in the first region 119 and the second region 121 with a carrier density lower than that of the channel region. For example, in the configuration shown in FIG. 2A, (A2) when a voltage of +V1 is applied to the gate electrode 106 and a voltage of V2=0 V is applied to the source electrode 114 (V1>V2), an intermediate voltage between a ground potential of the first shield electrode 118 and a voltage of +V1 applied to the gate electrode 106 (V1>V3>GND) is applied, and the first region 119 and the second region 121 can function as LDD regions. Also in this case, the potential difference between the source electrode 114 and the first shield electrode 118 becomes V2−V3=−ΔV (|ΔV|<V1), and the electric field applied to the end of the source electrode 114 can be reduced as compared with the case without the first shield electrode 118. Thus, the first region 119 and the second region 121 act as the LDD region, thereby relieving the generation of the high electric field region, particularly at the end of the drain electrode 116, and improving the reliability of the transistor 102A.

According to the present embodiment, the semiconductor layer 112 is formed of various semiconductor materials which can be formed of a thin film. For example, an oxide semiconductor may be used as the semiconductor layer 112. The oxide semiconductor includes one or more kinds of elements selected from indium, zinc, tin and gallium, and the metal oxide semiconductor formed of the oxides of these elements can be applied. As the semiconductor layer 112, hydrogenated amorphous silicon or polysilicon can be used.

The structure of the transistor 102A is suitable for preventing characteristic changes due to bias stress when an oxide semiconductor layer is used as the semiconductor layer 112. That is, it is possible to reduce the change of the threshold voltage by reducing the bias stress by the shield electrode between the gate electrode and the source electrode and between the gate electrode and the drain electrode of the transistor 102A using the oxide semiconductor.

The gate insulating layer 108 is formed of an insulating material such as silicon oxide, silicon nitride, or silicon oxynitride. When the gate insulating layer 108 is formed of two layers, the first layer and the second layer may be formed of different materials. The first shield electrode 118 and the second shield electrode 120 are formed of a metal such as molybdenum, titanium, or aluminum, similar to the gate electrode 106, the source electrode 114 and the drain electrode 116.

Figure 3:
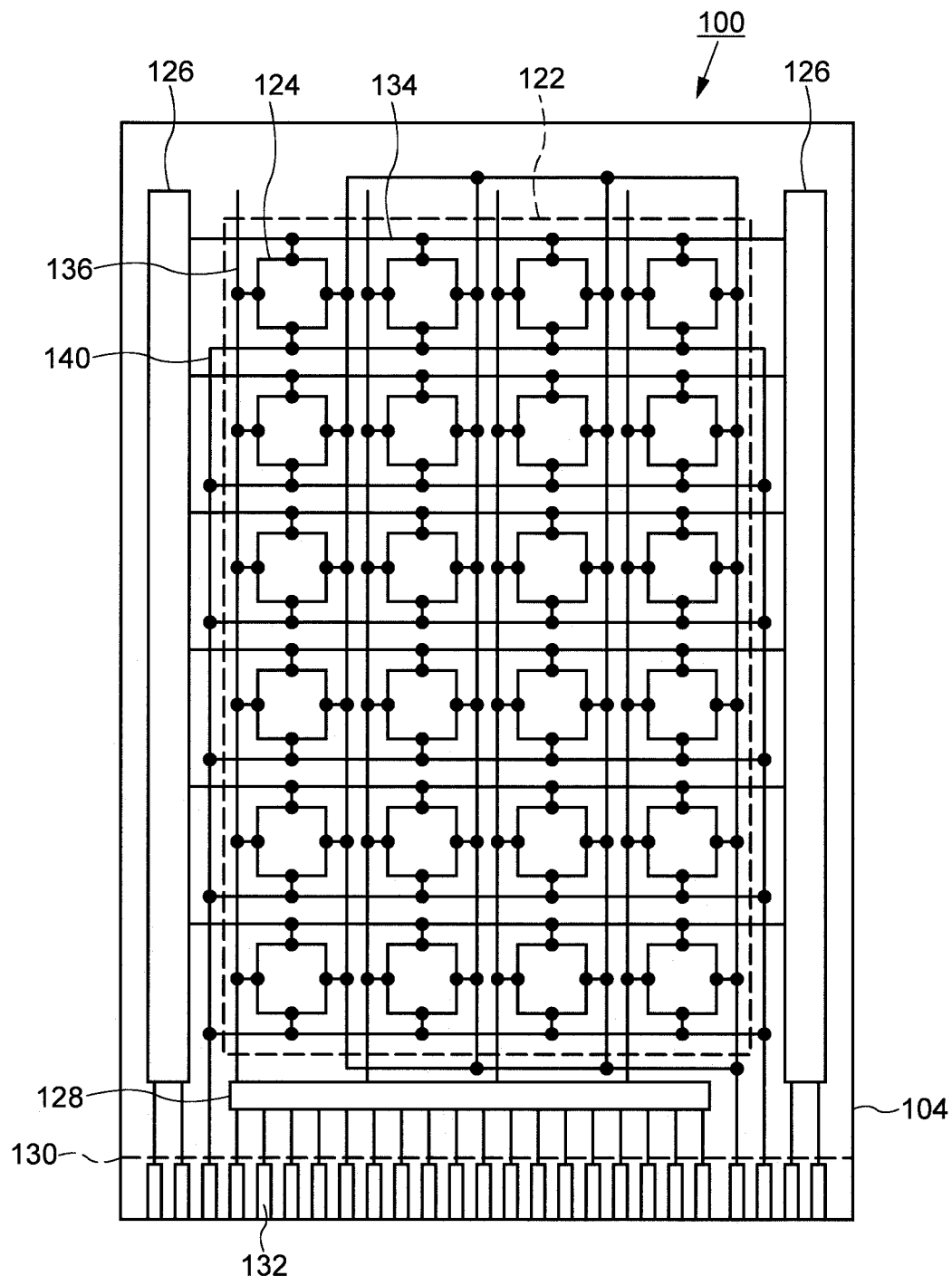
FIG. 3 shows a configuration of a display device according to an embodiment of the present invention.

FIG. 3 shows a configuration of a display device 100 in which the transistor 102A is used. The display device 100 includes a scanning line driving circuit 126, a data signal line selecting circuit 128, and a terminal part 130 in which terminal electrodes 132 are arranged. The display device 100 may be arranged with these parts on the substrate 104.

The display part 122 includes a plurality of pixels 124. The plurality of pixels 124 is arranged in a row direction and a column direction, for example. A scanning signal line 134 and a data signal line 136 are arranged in the display part 122. A power supply line 138 is also arranged on the display unit 122 when an organic electroluminescent element (organic EL element) is arranged on the pixel 124. A shield line 140 for controlling the potential of the shield electrodes (first shield electrode 118 and second shield electrode 120) are arranged on the display part 122. The scanning signal line 134 is connected to the scanning line driving circuit 126, and the data signal line 136 is connected to the data signal line selecting circuit 128. The scanning signal line 134, the data signal line 136, the power supply line 138, and the shield line 140 are connected to the pixel 124.

Figure 4A:
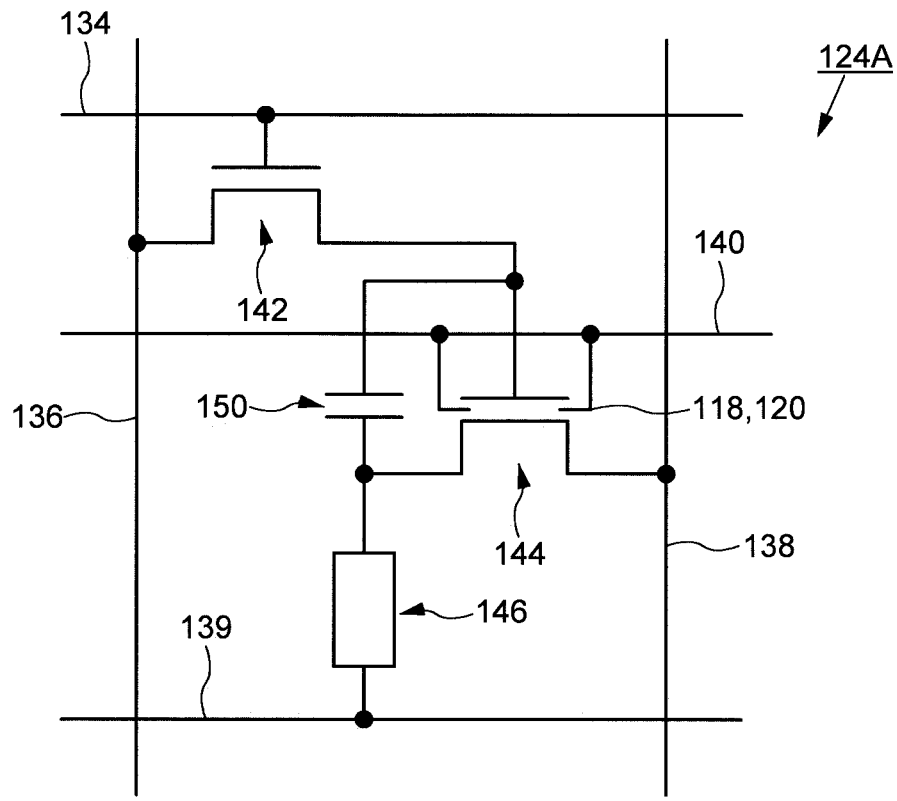
FIG. 4A shows an example of an equivalent circuit of a pixel in a display device according to an embodiment of the present invention in which an organic EL element is arranged.
Figure 4B:
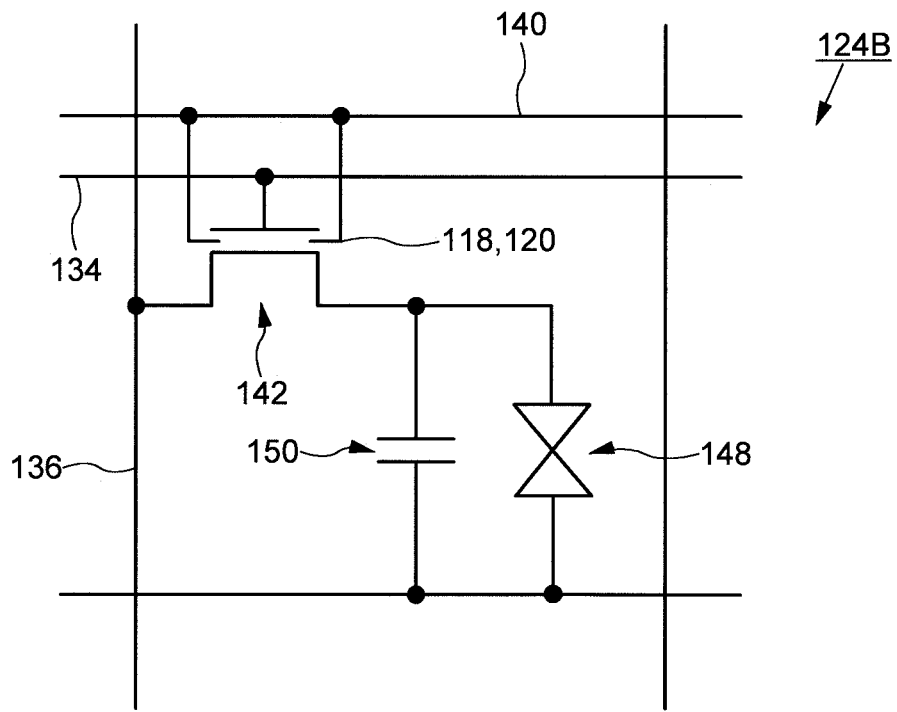
FIG. 4B shows an example of an equivalent circuit of a pixel in a display device according to an embodiment of the present invention in which a liquid crystal element is arranged.

FIG. 4A and FIG. 4B show an example of an equivalent circuit of a pixel.

FIG. 4A shows an example of an equivalent circuit of a pixel 124A in which an organic EL element 146 is arranged as a display element. The equivalent circuit of the pixel 124A shown in FIG. 4A includes a select transistor 142 connected to the scanning signal line 134 and the data signal line 136, a drive transistor 144 connected to the select transistor 142, a capacitive element 150 for holding the gate voltage of the drive transistor 144, and an organic EL element 146 connected to the drive transistor 144. The drive transistor 144 is connected between the power supply line 138 and the organic EL element 146, and a gate voltage is applied based on a data signal input through the selection transistor 142, and a current flowing through the organic EL element 146 is controlled. The organic EL element 146 is connected between the drive transistor 144 and the common line 139. The transistor 102A can be utilized as the drive transistor 144 in the display device 100 having such the pixel circuit. The equivalent circuit of the pixel 124A shown in FIG. 4A shows an aspect in which the shield electrodes (the first shield electrode 118 and the second shield electrode 120) are arranged on the drive transistor 144 and connected to the shield line 140.

The equivalent circuit of the pixel 124B shown in FIG. 4B includes the selection transistor 142 connected to the scanning signal line 134 and the data signal line 136, the liquid crystal element 148 connected to the selection transistor 142, and the capacitance element 150. The liquid crystal element 148 as a display element is operated by applying a voltage based on a data signal input through the selection transistor 142. The transistor 102A can be utilized as the selection transistor 142 in the display device 100 having such a pixel circuit. The liquid crystal element 148 is driven by polarity inversion driving. It is possible to prevent degradation by bias stress by arranging two shield electrodes (the first shield electrode 118 and the second shield electrode 120) in the transistor 102A.

According to the present embodiment, it is possible to prevent the characteristic changes due to bias stress by arranging the shield electrode so as to shield the electric field generated between the gate electrode and the source electrode and between the gate electrode and the drain electrode 116 in the structure of the transistor. Since the transistors having such a configuration are utilized in the pixels and the drive circuit of the display device, it is possible to exhibit high resistance to such bias stress during a standby period (non-selection period) in which no transistor is selected in the operation of the circuit.

Thus, a highly reliable display device can be presented.

Second Embodiment

This embodiment shows an example in which the arrangement of the first shield electrode and the arrangement of the second shield electrode is different from that of the transistor 102A shown in the first embodiment. The following description focuses on the parts different from the first embodiment.

Figure 5A:
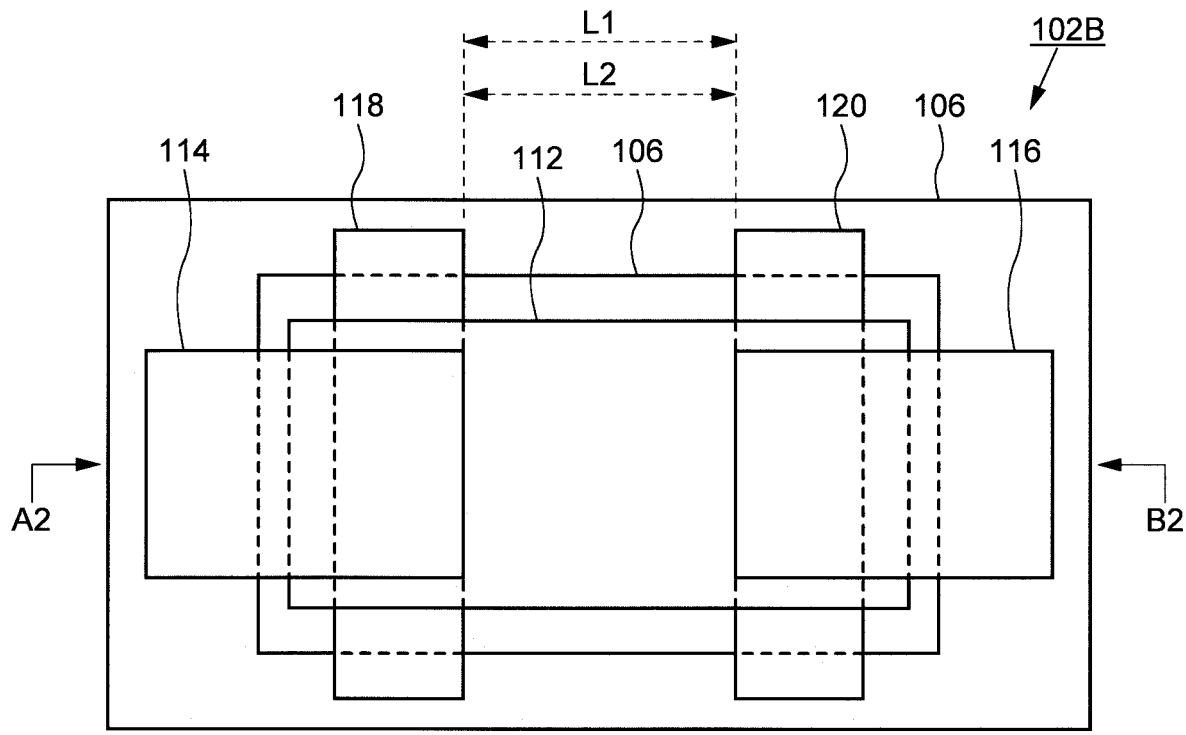
FIG. 5A shows a plan view of a transistor utilized in a display device according to an embodiment of the present invention.
Figure 5B:
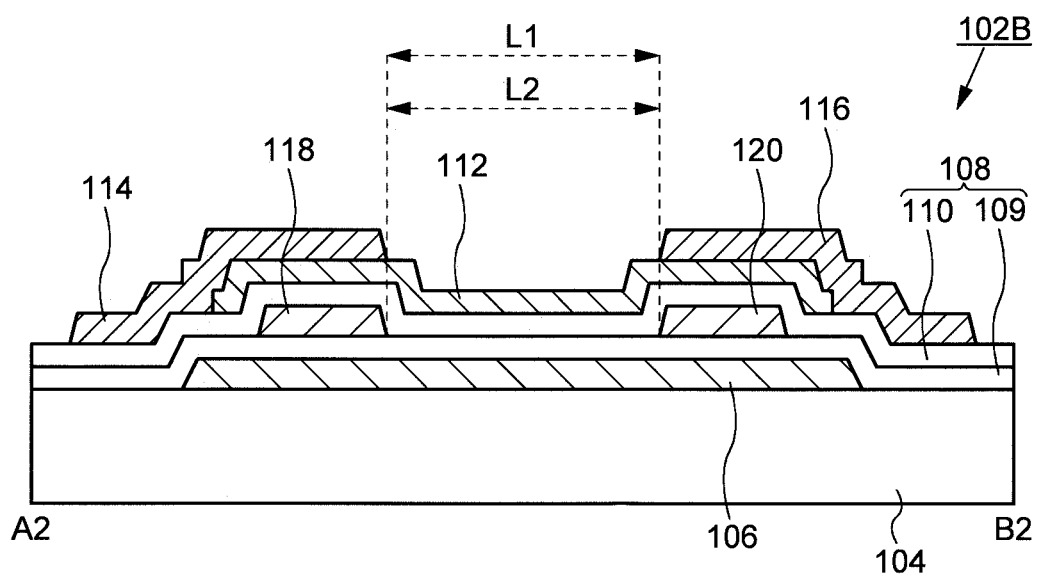
FIG. 5B shows a cross-sectional view of a transistor utilized in a display device according to an embodiment of the present invention.

FIG. 5A and FIG. 5B show a structure of a transistor 102B according to the present embodiment. FIG. 5A shows a plan view of transistor 102B, and FIG. 5B shows a cross-sectional view corresponding to line A2-B2 shown in FIG. 5A.

An end of the first shield electrode 118 on the side of the channel region coincides with an end of the source electrode 114 on the side of the channel region, and an end of the second shield electrode 120 on the side of the channel region coincides with an end of the drain electrode 116 on the side of the channel region, as shown in FIG. 5A and FIG. 5B. This arrangement of the electrodes does not form the first region 119 and the second region 121 which can form the offset region or the LDD region as described above in the transistor 102B. Since the first shield electrode 118 and the second shield electrode 120 are arranged in the transistor 102B, as in the first embodiment, the electric field between the gate electrode and the source electrode and between the gate electrode and the drain electrode can be reduced, and the bias stress effect (bias stress degradation) of the transistor 102B can be prevented.

Third Embodiment

This embodiment shows a structure in which one of the shield electrodes is not provided with respect to the transistor 102A shown in the first embodiment. The following description focuses on the parts different from the first embodiment.

Figure 6A:
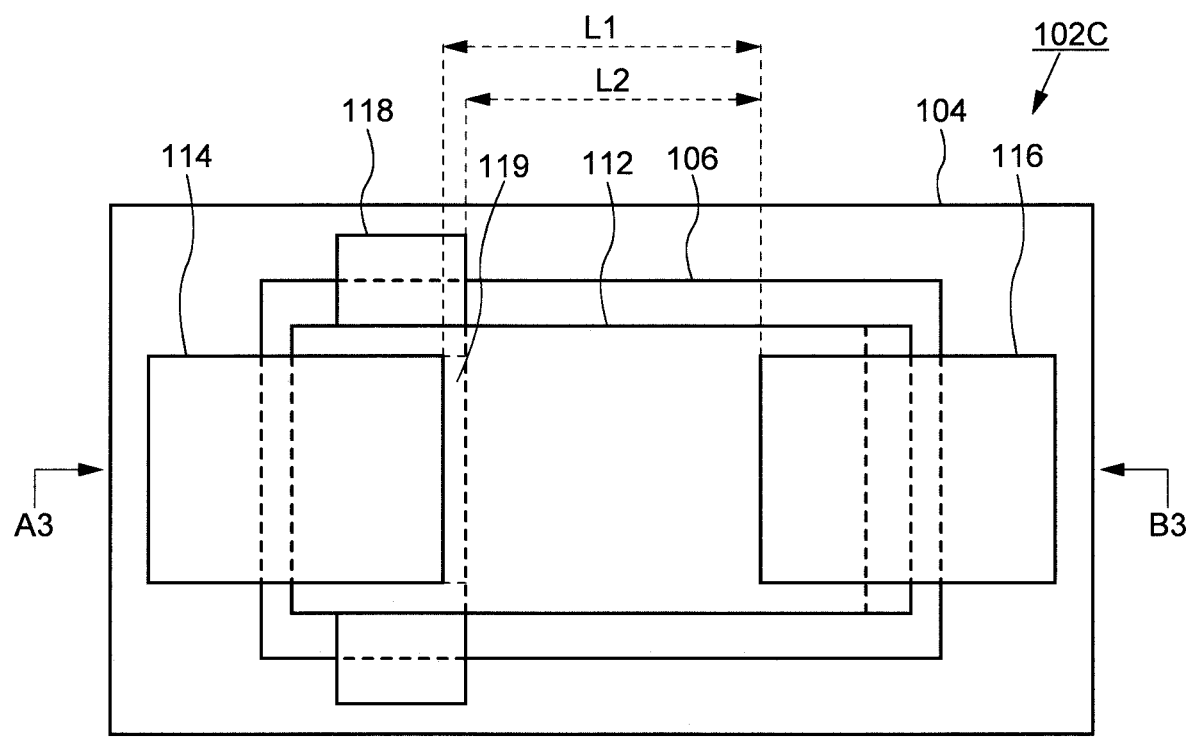
FIG. 6A shows a plan view of a transistor utilized in a display device according to an embodiment of the present invention.
Figure 6B:
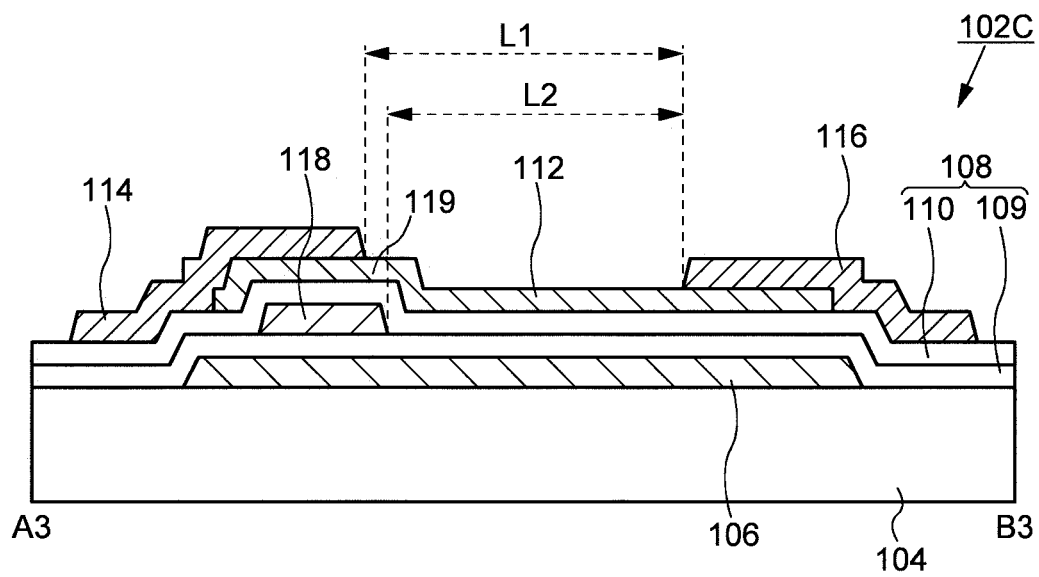
FIG. 6B shows a cross-sectional view of a transistor utilized in a display device according to an embodiment of the present invention.

FIG. 6A and FIG. 6B show a configuration of a transistor 102C according to the present embodiment. FIG. 6A shows a plan view of the transistor 102C, and FIG. 6B shows a cross-sectional view corresponding to the line A3-B3 shown in FIG. 6A.

FIG. 6A and FIG. 6B show a structure in which the first shield electrode 118 is arranged on the side of the source electrode 114 and the shield electrode is not arranged on the side of the drain electrode 116. For example, when the transistor 102C is an n channel type and is diode-connected in a circuit (in a state where a drain and a gate are connected), the drain electrode 116 is at the same potential as the gate electrode 106, so that the second shield electrode 120 can be omitted. The structure of the source electrode 114 is the same as that of the first embodiment, and the same effects can be obtained.

Fourth Embodiment

This embodiment shows one aspect of the transistor 102A shown in the first embodiment in which the gate electrode, the source electrode, and the drain electrode are arranged differently. The following description focuses on the differences from the first embodiment.

Figure 7A:
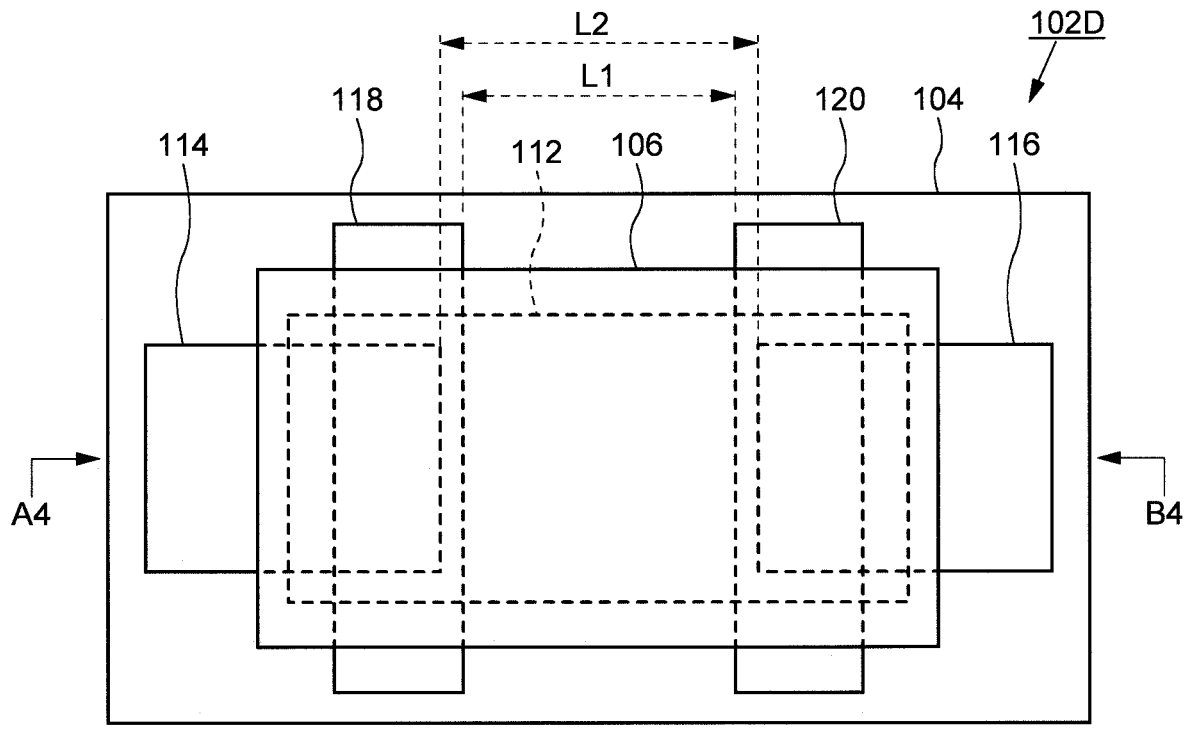
FIG. 7A shows a plan view of a transistor utilized in a display device according to an embodiment of the present invention.
Figure 7B:
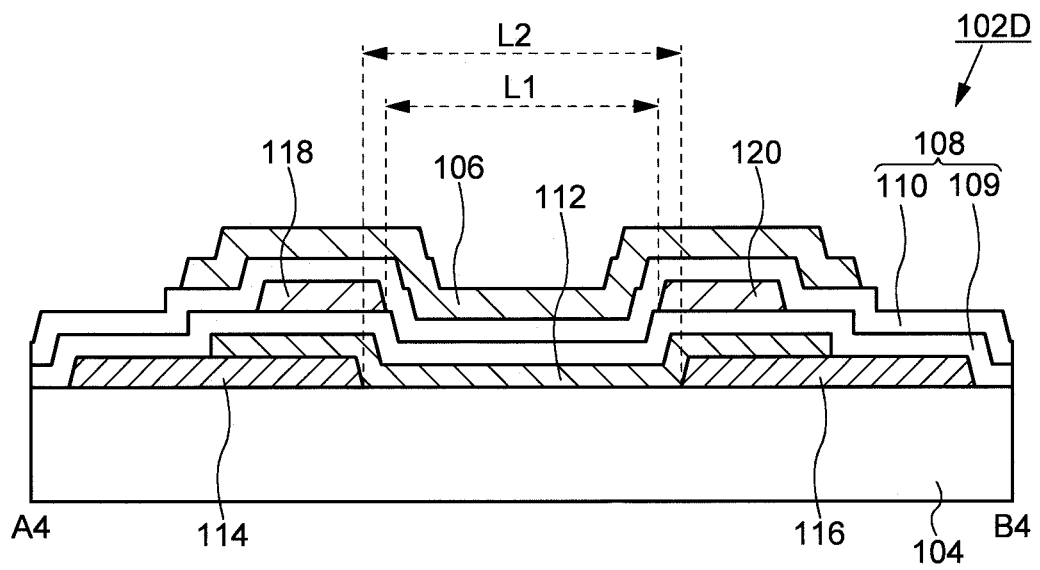
FIG. 7B shows a cross-sectional view of a transistor utilized in a display device according to an embodiment of the present invention.

FIG. 7A and FIG. 7B show a configuration of a transistor 102D according to the present embodiment. FIG. 7A shows a plan view of transistor 102D, and FIG. 7B shows a cross-sectional view corresponding to line A4-B4 shown in FIG. 7A.

The transistor 102D has a structure in which the source electrode 114 and the drain electrode 116 are arranged on the substrate 104, the semiconductor layer 112 is arranged in contact with the source electrode 114 and the drain electrode 116, and the gate insulating layer 108, the first shield electrode 118, the second shield electrode 120, and the gate electrode 106 are arranged thereon. The gate insulating layer 108 includes a first gate insulating layer 109 and a second gate insulating layer 110, and the first shield electrode 118 and the second shield electrode 120 are arranged between the first gate insulating layer 109 and the second gate insulating layer 110. The first shield electrode 118 is arranged on the first gate insulating layer 109 in a region overlapping the source electrode and the semiconductor layer 112, and the second shield electrode 120 is arranged on the first gate insulating layer 109 in a region overlapping the drain electrode and the semiconductor layer 112.

The transistor 102D according to the present embodiment differs from the transistor 102A according to the first embodiment in the stacking order of the gate electrode 106, the semiconductor layer 112, the source electrode 114, and the drain electrode 116. The transistor 102D has the first shield electrode 118 arranged between the gate electrode 106 and the source electrode 114 and the second shield electrode 120 arranged between the gate electrode 106 and the drain electrode 116, so that degradation due to bias stress can be prevented in the same manner as in the first embodiment.

Based on the structure of the transistor described in the first to fourth embodiments, the structure of the transistor and the display device manufactured by the transistor, which can be implemented by a person skilled in the art by appropriately changing the design, are also included in the technical scope of the present invention as long as they include the gist of the present invention.

Within the scope of the technical concept of the present invention, what those skilled in the art may come across in various modifications and corrections also fall within the scope of the present invention. For example, in one embodiment of the invention described above, additions, deletions, and modifications of configurations and additions, omissions, and modifications of conditions of steps, as appropriate, are also within the scope of the invention unless they depart from the spirit of the invention.

It is to be understood that the advantageous effects obtained in an embodiment of the present invention include the obvious advantageous effects described in this specification and the advantageous effects which a person skilled in the art can reasonably expect, and these advantageous effects are naturally provided by the present invention.

What is claimed is:

1. A display device comprising a plurality of thin film transistors, one of the plurality of thin film transistors comprising:
   a gate electrode;
   a semiconductor layer having a region overlapping the gate electrode;
   a gate insulating layer between the gate electrode and the semiconductor layer;
   a source electrode and a drain electrode in contact with a surface of the semiconductor layer opposite to a side of the gate insulating layer; and
   a first shield electrode arranged in a region where the source electrode and the gate electrode overlap, and a second shield electrode arranged in a region where the drain electrode and the gate electrode overlap,
   wherein the first shield electrode and the second shield electrode are arranged between the gate electrode and the semiconductor layer, and are insulated from the gate electrode, the semiconductor layer, the source electrode, and the drain electrode.

2. The display device according to claim 1, wherein one end of the source electrode and one end of the drain electrode are opposed to each other on the gate electrode, one end of the first shield electrode and one end of the second shield electrode are opposed to each other on the gate electrode, and
   a length of the one end of the first shield electrode and the one end of the second shield electrode separated from each other is shorter than or the same as a length of the one end of the source electrode and the one end of the drain electrode separated from each other.

3. The display device according to claim 1, wherein the one end of the source electrode opposed to the drain electrode and the one end of the first shield electrode opposed to the second shield electrode overlap the gate electrode,
   the one end of the first shield electrode is arranged inside the gate electrode from the one end of the source electrode,
   the one end of the drain electrode opposed to the source electrode and the one end of the second shield electrode opposed to the first shield electrode overlap the gate electrode, and
   the one end of the second shield electrode is arranged inside the gate electrode from the one end of the drain electrode.

4. The display device according to claim 1, wherein the gate insulating layer comprises a first gate insulating layer and a second gate insulating layer,
   wherein the first gate insulating layer is arranged between the gate electrode and the second gate insulating layer and the second gate insulating layer is arranged between the first gate insulating layer and the semiconductor layer, and
   the first shield electrode and the second shield electrode are arranged between the first gate insulating layer and the second gate insulating layer.

5. The display device according to claim 1, wherein each of the first shield electrode and the second shield electrode is configured to apply a constant potential.

6. The display device according to claim 5, wherein the constant potential is a ground potential.

7. The display device according to claim 1, wherein the gate electrode is configured so that a first voltage is applied in a first period, and a second voltage higher than the first voltage is applied in a second period,
   the first shield electrode and the second shield electrode are configured so that a constant voltage is applied, and
   the constant voltage is a voltage between the first voltage and the second voltage.

8. The display device according to claim 1, wherein the semiconductor layer is an oxide semiconductor layer.

9. The display device according to claim 1, further comprising:
   a display element,
   wherein one of the source electrode and the drain electrode is connected to the display element.

10. The display device according to claim 9, wherein the display element is an electroluminescent element or a liquid crystal element.

* * * * *